(12) United States Patent
Bakalski et al.

(10) Patent No.: US 9,570,974 B2
(45) Date of Patent: Feb. 14, 2017

(54) HIGH-FREQUENCY SWITCHING CIRCUIT

(75) Inventors: Winfried Bakalski, Munich (DE); Hans Taddiken, Munich (DE); Nikolay Ilkov, Munich (DE); Herbert Kebinger, Mettenheim (DE)

(73) Assignee: Infineon Technologies AG, Munich (DE)

( * ) Notice: Subject to any disclaimer, the term of this patent is extended or adjusted under 35 U.S.C. 154(b) by 605 days.

(21) Appl. No.: 12/704,737

(22) Filed: Feb. 12, 2010

(65) Prior Publication Data
US 2011/0199146 A1 Aug. 18, 2011

(51) Int. Cl.
H03K 17/16 (2006.01)
H03K 17/687 (2006.01)
H02M 3/07 (2006.01)

(52) U.S. Cl.
CPC ............ H02M 3/07 (2013.01); H03K 17/161 (2013.01); H03K 17/6871 (2013.01); *H03K 2217/0018* (2013.01)

(58) Field of Classification Search
CPC .............. H03K 17/161; H03K 17/6871; H03K 2217/0018
USPC ......... 327/382, 389, 427, 434–436, 530, 327/534–537, 545, 546; 333/103
See application file for complete search history.

(56) References Cited

U.S. PATENT DOCUMENTS

| | | | |
|---|---|---|---|
| 5,471,414 A * | 11/1995 | Kumar et al. ............. | 708/714 |
| 5,883,541 A | 3/1999 | Tahara et al. | |
| 6,097,113 A | 8/2000 | Teraoka et al. | |
| 6,249,027 B1 * | 6/2001 | Burr .......................... | 257/350 |
| 6,333,571 B1 | 12/2001 | Teraoka et al. | |
| 6,621,325 B2 * | 9/2003 | Hart et al. ................. | 327/534 |
| 6,700,433 B2 | 3/2004 | Zuk | |
| 7,199,635 B2 | 4/2007 | Nakatsuka et al. | |
| 7,245,887 B2 * | 7/2007 | Khorram .................... | 455/121 |
| 7,564,103 B2 | 7/2009 | Losehand et al. | |
| 7,710,189 B2 | 5/2010 | Toda | |
| 7,910,993 B2 * | 3/2011 | Brindle et al. ............. | 257/347 |
| 2003/0085751 A1 | 5/2003 | Miyazaki et al. | |
| 2004/0085118 A1 | 5/2004 | Numata | |
| 2004/0207454 A1 | 10/2004 | Hidaka et al. | |
| 2004/0251952 A1 | 12/2004 | Nakatsuka et al. | |
| 2005/0143086 A1 * | 6/2005 | Schwarz ................... | 455/452.2 |

(Continued)

FOREIGN PATENT DOCUMENTS

DE    198 27 938 A1    4/1999
DE    102005049247 A1    5/2006

(Continued)

OTHER PUBLICATIONS

Lin, Y.-H., et al., "A 900-MHz 30-dBm Bulk CMOS Transmit/Receive Switch Using Stacking Architecture, High Substrate Isolation and RF Floated Body," Progress in Electromagnetics Research C, 2009, pp. 91-107, vol. 11, Taiwan, R.O.C.

*Primary Examiner* — Lincoln Donovan
*Assistant Examiner* — Colleen O Toole
(74) *Attorney, Agent, or Firm* — Slater Matsil, LLP

(57) ABSTRACT

A high-frequency switching circuit includes a high-frequency switching transistor, wherein a high-frequency signal-path extends via a channel-path of the high-frequency switching transistor. The high-frequency switching circuit includes a control circuit and the control circuit is configured to apply at least two different bias potentials to a substrate of the high-frequency switching transistor, depending on a control signal received by the control circuit.

8 Claims, 10 Drawing Sheets

(56) References Cited

U.S. PATENT DOCUMENTS

| | | |
|---|---|---|
| 2006/0118884 A1 | 6/2006 | Losehand et al. |
| 2006/0132218 A1* | 6/2006 | Tschanz et al. ............... 327/534 |
| 2006/0252394 A1 | 11/2006 | Suwa et al. |
| 2007/0069291 A1 | 3/2007 | Stuber et al. |
| 2008/0079653 A1 | 4/2008 | Ahn et al. |
| 2008/0272824 A1 | 11/2008 | Fu et al. |
| 2009/0278206 A1 | 11/2009 | Losehand et al. |
| 2009/0291645 A1 | 11/2009 | Chu et al. |
| 2012/0169398 A1 | 7/2012 | Brindle et al. |

FOREIGN PATENT DOCUMENTS

| | | |
|---|---|---|
| JP | 2000223902 A | 8/2000 |
| JP | 2002232278 A | 8/2002 |
| JP | 2006304013 A | 11/2006 |
| JP | 2009-500868 A | 1/2009 |
| JP | 2010-028304 A | 2/2010 |

\* cited by examiner

HIGH-FREQUENCY SWITCHING CIRCUIT

TECHNICAL FIELD

The present invention relates to the field of semiconductor electronics and particularly to the technical partial field of high-frequency switches.

BACKGROUND

High-frequency switches are used for passing or blocking high-frequency signals. In the case of passing a high-frequency signal, a high-frequency switch should have a low ohmic resistance and, in the case of blocking a high-frequency, the switch should have a constant capacitance, which is sufficiently small or even as small as possible. High-frequency switches may be realized in different technologies like GaAs technology or MOS technology (MOS=metal oxide semiconductor).

High-frequency switches are commonly used in mobile phones, which leads to the desire to have a high-frequency switch with a better trade-off between intermodulation characteristics, which are important for high data rate systems like UMTS (Universal Mobile Telecommunication System), and current consumption, wherein a low current consumption is important for a high standby time of the mobile phone.

SUMMARY OF THE INVENTION

In accordance with a first aspect, embodiments of the present invention provide a high-frequency switching circuit. The high-frequency switching circuit includes a first high-frequency switching transistor, wherein a high-frequency signal path extends via a channel-path of the first high-frequency switching transistor, and a control circuit configured to apply at least two different bias potentials to a substrate of the high-frequency switching transistor, depending on a control signal received by the control circuit.

In accordance with a second aspect, embodiments of the present invention provide a high-frequency switching circuit.

The high-frequency switching circuit includes a first high-frequency switching transistor that includes a first and a second channel terminal, wherein a high-frequency signal path extends via a channel-path of the first high-frequency switching transistor, and wherein the second channel terminal of the first high-frequency switching transistor is coupled to a potential node via a first channel resistor. The high-frequency switching circuit further includes a second high-frequency switching transistor that includes a first and a second channel terminal, wherein the high-frequency signal path extends via a channel-path of the second high-frequency switching transistor. The first channel terminal of the second high-frequency switching transistor is coupled to the second channel terminal of the first high-frequency switching transistor. The second channel terminal of the second high-frequency switching transistor is coupled to the potential node. The high-frequency switching circuit is configured to selectively pull the potential node to a predetermined potential or to leave the potential node floating.

BRIEF DESCRIPTION OF THE DRAWINGS

Embodiments according to the present invention will be explained below in more detail with reference to the accompanying figures, wherein.

DETAILED DESCRIPTION OF ILLUSTRATIVE EMBODIMENTS

Figure 1:
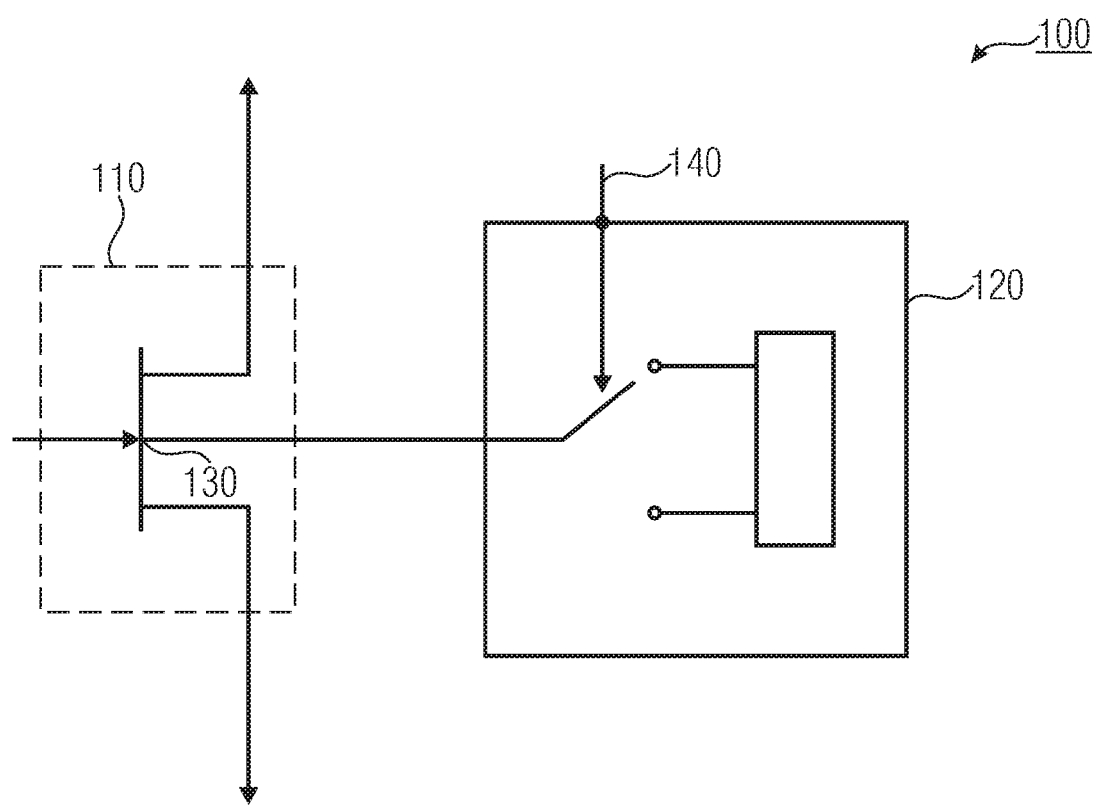
FIG. 1 shows a block schematic diagram of a high-frequency switching circuit in accordance with an embodiment of the present invention.

Before embodiments of the present invention will be explained in greater detail in the following taking reference to the figures, it is to be pointed out that the same or functionally equal elements are provided with the same reference numerals in the figures, and that a repeated description of these elements shall be omitted. Hence, the description of the elements provided with the same reference numerals is mutually interchangeable and/or applicable in the various embodiments.

FIG. 1 shows a schematic circuit diagram of a high-frequency switching circuit 100 in accordance with an embodiment of the present invention. The high-frequency switching circuit 100 includes a high-frequency switching transistor 110 and a control circuit 120. A high-frequency signal path extends via a channel-path of the high-frequency switching transistor 110. The high-frequency signal path may, for example, be an electrical path between a high-frequency signal receiver or transmitter and a high-frequency antenna of a mobile phone. The control circuit 120 is configured to apply at least two different bias potentials to a substrate 130 of the high-frequency switching transistor 110, depending on a control signal 140 received by the control circuit 120.

The high-frequency switching transistor 110 may be a MOS transistor, for example, an n-channel MOS transistor with a lowly n-doped substrate 130. In some embodiments the transistor 110 could be realized by another semiconductor technology, for example, such as GaAs technology. The substrate 130 of the high-frequency switching transistor 110 may be an n-well, commonly known from SOI (SOI=silicon on insulator) or triple-well processes. Especially, the substrate 130 of the high frequency switching transistor 110 may not be electrically coupled to substrates of other semiconductor elements, which are, for example, on the same die like the high-frequency switching circuit 100. In some embodiments the high-frequency switching circuit 100 could include two or more high-frequency switching transistors 110, wherein substrates 130 of the high-frequency switching transistors 110 may be coupled to each other and the high-frequency signal path may extend via channel-paths of the high-frequency switching transistors 110, which, for example, could be stacked (in series) to allow higher drain/source voltages (or a higher voltage) to be switched.

In high-frequency switching circuits it is desirable to have good intermodulation characteristics, i.e., low intermodulation distortions. Good intermodulation characteristics may be achieved by reducing the non-linearities of high-frequency switching circuits, for example, by reducing parasitic capacitances between drain/source regions and substrates of the high-frequency switching transistors. The high-frequency switching circuit 100 reduces these capacitances by applying a bias potential to the substrate 130 of the high-frequency switching transistor 110. By applying a bias potential to the substrate 130 parasitic capacitances between a first channel terminal (for example, a source) and the substrate 130 and parasitic capacitances between a second channel terminal (for example, a drain) and the substrate 130 are reduced, which leads to smaller non-linearities of the high-frequency switching transistor 110 and to better intermodulation characteristics of the high-frequency switching transistor 110 and the high-frequency switching circuit 100.

The higher the potential difference between a bias potential of the substrate 130 and a reference potential, for example, a ground potential applied to a ground terminal of the high frequency switching circuit 100, the lower the parasitic capacitances and the better the intermodulation characteristics (i.e., the lower the intermodulation distortions) of a high-frequency switching transistor 110. One drawback of raising the bias potential of the substrate 130 is a higher current consumption, for example, of the control circuit 120 and the complete high-frequency switching circuit 100. Another drawback is the fact that raising a substrate bias potential can lead to a breakdown, for example, of a np+ diode between a substrate region (for example, an n-well) and a channel terminal (for example, a p+ doped source or drain region) of the high-frequency switching transistor 110 and possibly to a reduction of lifetime.

In other words raising the bias potential of the substrate 130 can lead to unreliability of the high-frequency switching transistor 110. The high-frequency switching circuit 100, which is shown in FIG. 1, avoids this problem by selectively applying two different bias voltages to the substrate 130 of the high-frequency switching transistor 110. In other words, the high-frequency switching circuit 100 combines, depending on the control signal 140, good intermodulation characteristics with a low current consumption and high reliability and achieves a better tradeoff between intermodulation characteristics and current consumption.

Implemented in a mobile phone, the high-frequency switching circuit 100 could offer a first mode in which the high frequency switching circuit 100 includes low intermodulation distortions, for example, suitable for high data rate applications like UMTS, and a second mode, in which the high frequency switching circuit 100 includes a low current consumption, but still offers low enough intermodulation distortions, for example, suitable for lower data rate applications like GSM (Global System for Mobile Communications) or low power applications like a receive mode of the mobile phone (for example, if the mobile phone is in a standby mode).

A processor of the mobile phone may only switch to a higher substrate bias potential (first mode) when it is needed, for example, for an UMTS transmission. Therefore the high frequency switching circuit 100 would be in the low current consumption mode (second mode) most of the time, which leads to a longer standby time of the mobile phone, but still offers low intermodulation distortions when it is needed.

According to some embodiments, also a logic table of the mobile phone may be used to determine certain HF-paths, in which a high linearity, and therefore a high substrate bias potential, is needed.

Figure 2:
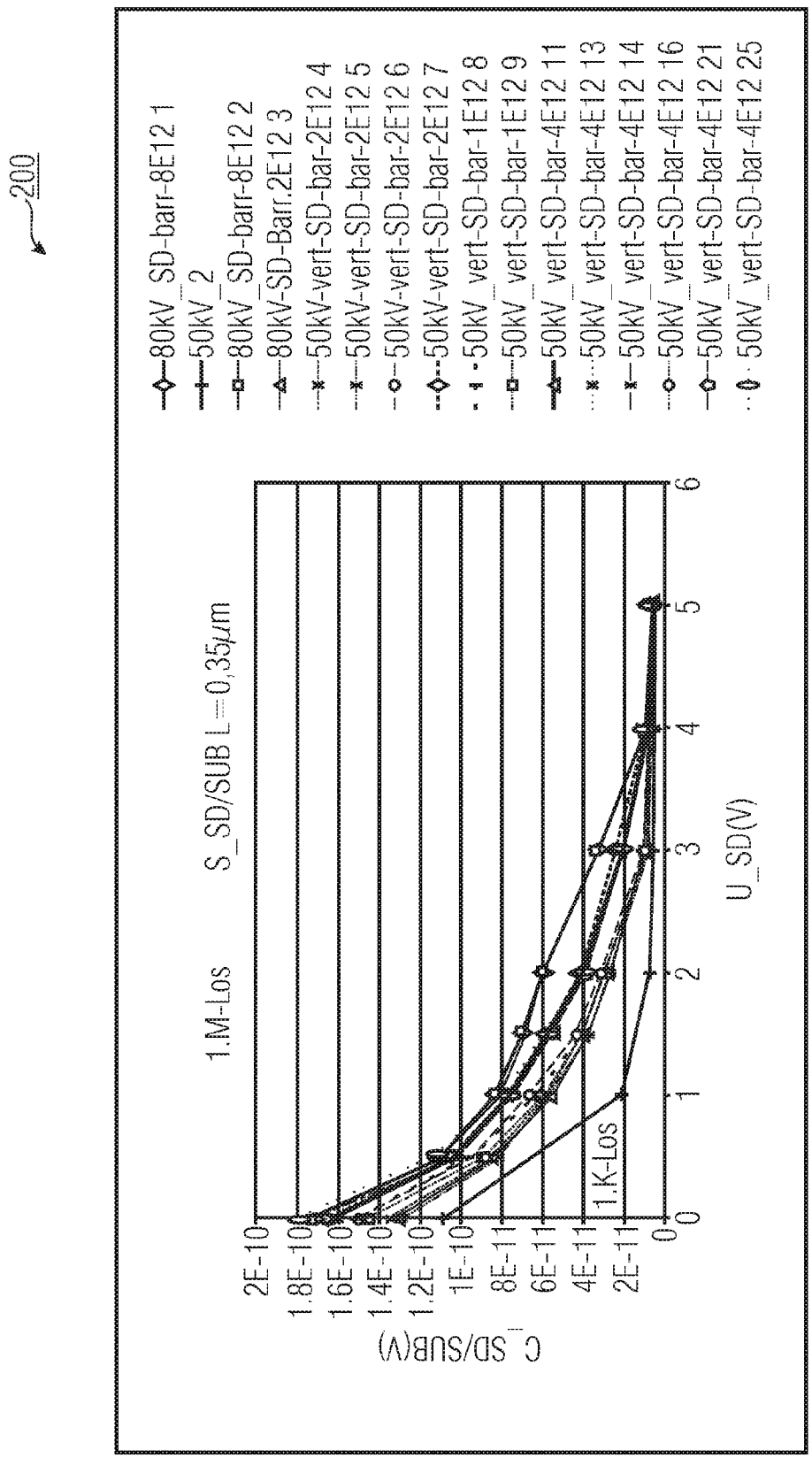
FIG. 2 shows a diagram of source/drain capacities in relation to substrate potentials of high-frequency switching transistors.

FIG. 2 shows a diagram 400 of source/drain capacities in dependence on substrate potentials of high-frequency switching transistors, for example, high-frequency switching transistors 110 in accordance with FIG. 1. On the abscissa one can find the different substrate bias potentials. On the ordinate one can find the resulting parasitic capacitances between the channel terminals and the substrate of the high-frequency switching transistors. The different lines show different versions of high-frequency switching transistors with different doping densities. It is clearly shown in the diagram in FIG. 2 that the parasitic capacitances get lower with a higher substrate bias potential. Therefore non-linearity is reduced and the intermodulation characteristics (lowering the intermodulation distortions) of the high frequency switching transistors are improved with higher substrate bias potentials.

Figure 3:
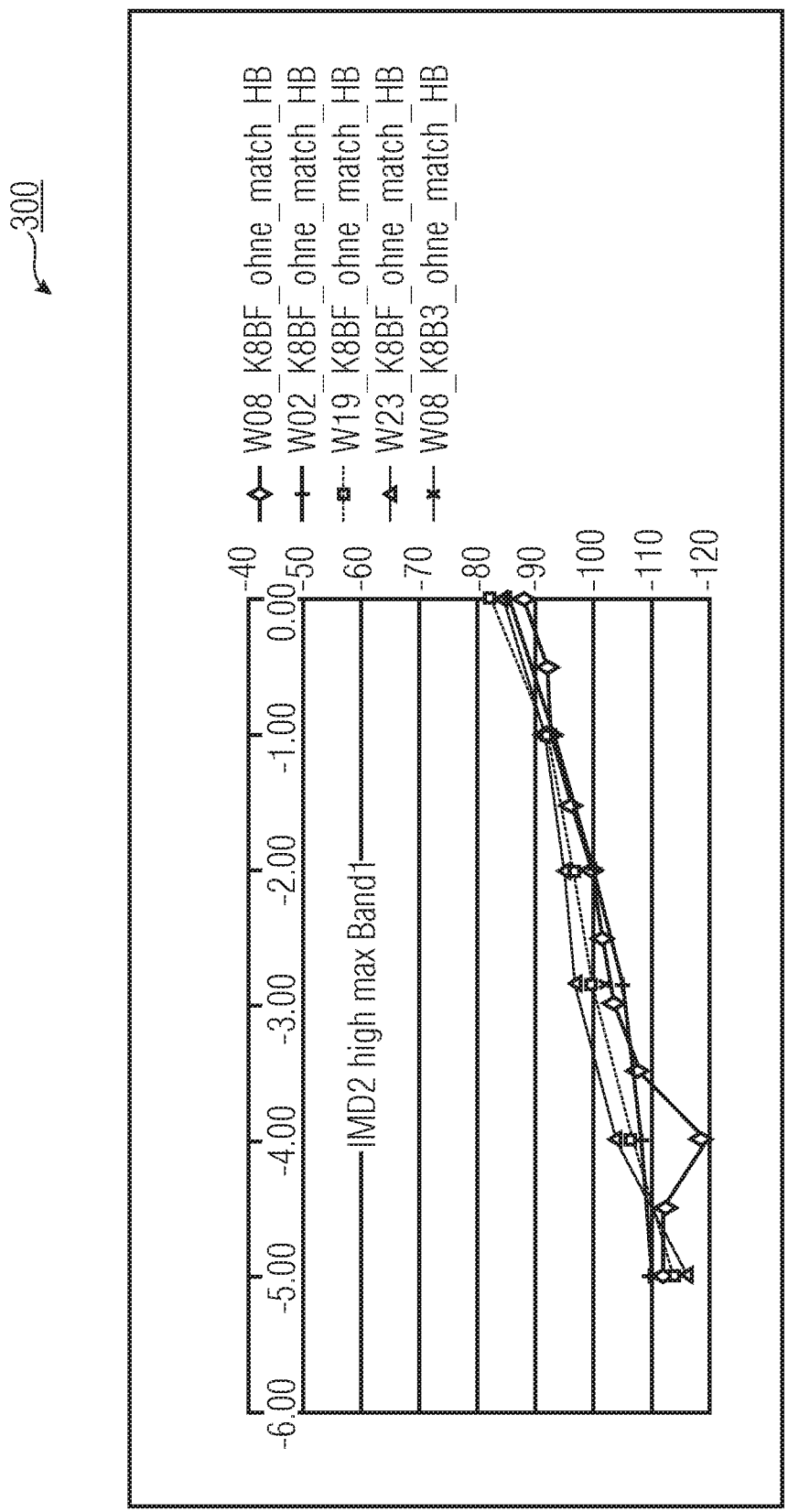
FIG. 3 shows a diagram of second order intermodulation distortion products in relation to substrate potentials of high-frequency switching transistors.

FIG. 3 shows a diagram 300 of second order intermodulation distortion products in relation to substrate potentials of high-frequency switching transistors, for example, the high-frequency switching transistor 110 in accordance with FIG. 1. The abscissa of the diagram 300 shows different substrate bias potentials, the ordinate of the diagram 300 shows values of the intermodulation distortion second order. The different lines show different versions of high-frequency switching transistors with different doping densities. The diagram 300 clearly shows that higher substrate bias potentials lead to lower intermodulation distortions, which was already mentioned before.

The diagram 400 and the diagram 300 together show that non-linearity may be minimized with a reduction of the transfer capacitances (source/drain capacitances) of the high frequency switching transistors.

Figure 4:
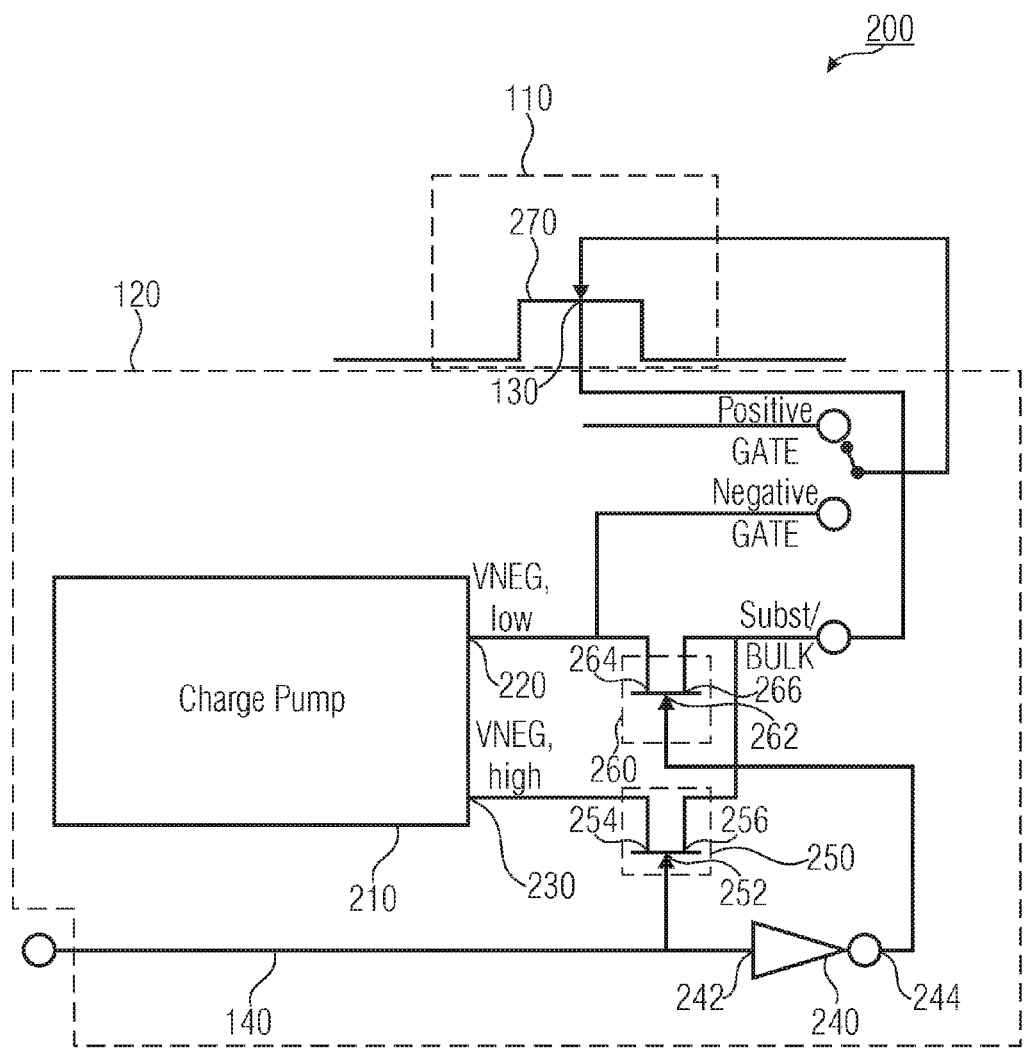
FIG. 4 shows a schematic circuit diagram of a high-frequency switching circuit in accordance with an embodiment of the present invention.

FIG. 4 shows a schematic circuit diagram of a high-frequency switching circuit 200 in accordance with an embodiment of the present invention. The high-frequency switching circuit 200 includes a control circuit 120 and a high-frequency switching transistor 110. The control circuit 120 includes a voltage source, which is configured to provide two different bias potentials. The voltage source may include a charge pump 210, wherein the charge pump 210 may be configured to provide the two different bias potentials simultaneously. It is also possible that the charge pump 210 provides the two different bias potentials selectively, for example, depending on the control signal 140. The charge pump 210 in the high-frequency switching circuit 200 includes a first output 220, wherein the first output 220 is configured to provide a first bias potential of the two bias potentials. The charge pump 210 further includes a second output 230, wherein the second output 230 is configured to provide a second bias potential of the two bias potentials.

In the following a bias potential can also be called a bias voltage, wherein the voltage may be defined in relation to a supply potential of the high-frequency switching circuit, for example, a ground potential applied to a ground terminal of the high-frequency switching circuit.

The control circuit 120 of the high-frequency switching circuit 200 may be configured to selectively connect the substrate 130 of the high-frequency switching transistor 110 to the first output 220 or the second output 230 of the charge pump 210, depending on the control signal 140. In the high-frequency switching circuit 200, this function of the control circuit 120 is implemented by using a first control circuit switching transistor 250, a second control circuit switching transistor 260 and an inverter 240.

As mentioned before, the switching function of the control circuit 120 is implemented by the first control circuit switching transistor 250, the second control circuit switching transistor 260 and the inverter 240. A gate 252 of the first control circuit switching transistor 250 is coupled to an input 242 of the inverter 240. A first channel terminal 254 (for example, a source) of the first control circuit switching transistor 250 is coupled to the second output 230 of the charge pump 210. A second channel terminal 256 (for example, a drain) of the first control circuit switching transistor 250 is coupled to the substrate 130 of the high-frequency switching transistor 110. A gate 262 of the second control circuit switching transistor 260 is coupled to an output 244 of the inverter 240. A first channel terminal 264 (for example, a source) of the second control circuit switching transistor 260 is coupled to the first output 220 of the charge pump 210. A second channel terminal 266 (for example, a drain) of the second control circuit switching transistor 260 is coupled to the substrate 130 of the high-frequency switching transistor 110. The inverter 240 is configured to receive the control signal 140 at its input 242 and to provide an inversed version of the control signal 140 at its output 244. The control signal 140 can, for example, be a mode selection signal (for example, for activating a UMTS mode in a mobile phone).

According to some embodiments the control circuit 120 may optionally be configured to either (selectably) connect the gate 270 of the high-frequency switching transistor 110 to the first output 220 of the charge pump 210, which, for example, provides a negative gate voltage, to place a channel-path of the high-frequency switching transistor 110 in a high impedance state or to an output of a second voltage source, which, for example, provides a positive gate voltage, to place a channel-path of the high-frequency switching transistor 110 in a in a low impedance state, depending on a switch state signal.

Connecting the gate 270 to the first output 220 of the charge pump 210 or, in other words, applying a negative gate voltage (for example, −3V) to the gate 270 of the high-frequency switching transistor 110 may lead to a closing of the channel-path of the high-frequency switching transistor 110 (placing the channel-path of the high-frequency switching transistor 110 in a high impedance state). In some embodiments it could be also possible that applying a negative gate voltage to the high-frequency switching transistor 110 leads to an opening of the channel-path of the high-frequency switching transistor 110 (placing the channel-path in a low impedance state), depending on the type of the used transistor.

A value of the negative gate voltage may be the same like a value of the first bias potential (first bias voltage). In other words, the first output 220 of the charge pump 210 may be coupled to the high frequency switching transistor 110 to selectively provide, the first bias potential to the substrate 130 of the high-frequency switching transistor 110 and a gate potential to the gate 270 of the high-frequency switching transistor 110. With the control circuit 120 shown in FIG. 4 no additional charge pump is necessary for producing a negative gate voltage (for example, for opening or closing the channel-path of the high-frequency switching transistor 110), because the charge pump 210 may be used to provide both, the first bias potential and the gate potential (for example, a negative gate potential).

A potential difference between the first bias potential, provided at the first output 220 of the charge pump 210, and a reference potential, for example, a ground potential applied to a ground terminal of the high-frequency switching circuit 110 may be lower than a potential difference between the second bias potential, provided at the second output 230 of the charge pump 210, and the reference potential. In other words an absolute value of the first substrate bias voltage may be lower than an absolute value of the second bias voltage. For example, the first bias voltage may be −3 Volt, which may be the same like a negative gate voltage, for example, used for opening or for closing the high-frequency switching transistor 110, and the second bias voltage may be, for example, −5 Volt.

In the following the function of the control circuit 120 will be explained. It is assumed that the channel-paths of the control circuit transistors 250, 260 are placed in a low impedance state, when a logically "high" signal is applied to the gates of the control circuit transistors 250, 260, and that the channel-paths of the control circuit transistors 250, 260 are placed in a high impedance state, when a logically "low" signal is applied to the gates of the control circuit transistors 250, 260. The control signal 140 can, for example, be a logic signal, for example, with a voltage of +3 V for a "high" signal state and a voltage of −3 V for a "low" signal state. If the control signal 140 is in a high state, a high voltage (for example, +3 Volt) is applied to the gate 252 of the first control circuit switching transistor 250 and the input 242 of the inverter 240, such that the channel-path of the control circuit switching transistor 250 is in a low impedance state. The inverter 240 provides an inversed version of the control signal 140 at its output 244, thus a low signal (for example, 0V or −3 volt) is applied to the gate 262 of the second control circuit switching transistor 260, placing the channel-path of the second control circuit switching transistor 260 in a high impedance state. Placing the channel-path of the first control circuit switching transistor 250 in the low impedance state and the channel-path of the second control circuit switching transistor 260 in the high impedance state leads to a connection of the substrate 130 of the high-frequency switching transistor 110 with the second output 230 of the charge pump 210, which means the second bias potential (second bias voltage, for example, −5V) is applied to the substrate 130 of the high-frequency switching transistor 110, such that low intermodulation distortions at the high-frequency switching transistor 110 are achieved.

When the control signal 140 is in a low state, for example, if a voltage of 0V or −3 V (depending on the Vth of the control circuit transistors 250, 260) is applied, the channel-path of the first control circuit switching transistor 250 is placed in a high impedance state and the channel-path of the second control circuit switching transistor 260 is placed in a low impedance state. This leads to a connection between the substrate 130 of the high-frequency switching transistor 110 and the first output 220 of the charge pump 210. In other words the first bias potential (first bias voltage, for example, −3V) is applied to the substrate 130 of the high-frequency switching transistor 110, such that a low current consumption of the high-frequency switching circuit 200 is achieved. An absolute value of the first bias voltage can, for example, be the same as an absolute value of a negative gate voltage of the high-frequency switching transistor 110.

As mentioned before, higher (in terms of an absolute value) substrate bias voltages can lead to better intermodulation characteristics but higher current consumption. For example, setting the control signal 140 in the "high" state and establishing a low ohmic connection between the substrate 130 and the second output 230 of the charge pump 210, thereby providing the high substrate bias voltage, leads to better intermodulation characteristics than setting the control signal 140 to a low voltage and establishing a low ohmic connection between the substrate 130 and the first output 220 of the charge pump 210, thereby providing the low substrate bias voltage. A current consumption of the high-frequency switching circuit 200 can, for example, be lower when the control signal 140 is in a "low" state, than when the control signal 140 is in a "high" state. Implemented in a mobile phone, a mobile phone processor could, for example, set the control signal 140 in a "high" state when the requirements in regards to intermodulation characteristics are high, for example, in a UMTS mode, and set the control signal 140 in a "low" state, when good intermodulation characteristics are not essential but a low current consumption is desired, for example in a GSM mode or a receive mode.

Because of the fact that low IMD (IMD=intermodulation distortions) and low distortions are not specified and necessary in every case, in mobile radio systems, for example, only in a UMTS mode, a user scenario is applicable, which determines how long the component (the mobile phone) is in the corresponding mode (for example, the UMTS mode).

Furthermore, a bias voltage is preferably produced, for example, using a charge pump, but a higher bias voltage also means a higher current consumption. Thus, for the case that the linearity requirements are small a reduction of the bias voltage is desired. Furthermore, a bias voltage influences the reliability of a high frequency switching transistor, especially regarding to breakdown voltages of wells (for example, in an n-well substrate).

Embodiments according to the present invention use the fact that different modes (for example, a UMTS on mode and a UMTS off mode) are possible and make a substrate bias voltage switchable. The information of which mode is presently used may be gained from the logic signals already available very easily and may be used, for example, as the control signal 140 of the high frequency switching circuit 100. For example, in embodiments the substrate bias voltage would only be raised when it is needed, for example, in a UMTS mode. This means, for example, during the switching to a UMTS path (mode) the substrate bias voltage would be raised simultaneously. In another case the substrate bias voltage would be reduced (for example, in a GSM case). For example, in a receive mode, where the power is much lower in general than in a transmit case, a bias substrate potential could be lowered furthermore (for example, even more than in the GSM case). For example, in the case of the receive mode, where a current consumption of a mobile phone is relatively small, a reduction of the current consumption of the high-frequency switching circuit 100 means an improvement of the standby time of the mobile phone. Summed over time, the higher bias voltage would only be active a short time in comparison to the low bias voltages, which leads to an improvement of the reliability (or lifetime) and the standby time of the mobile phone.

In other words the high-frequency switching circuit 200 in FIG. 4 shows a possible implementation, where two voltages may be switched, where it is sufficient to switch only one high voltage.

According to some embodiments, alternatively a control circuit of the charge pump could be manipulated, which means the charge pump may only have one output, which may be configured to selectively provide a low (for example, −3V) and a high (for example, −5V) bias voltage. A drawback of this solution may be that switching from one voltage to another may take a certain settling time.

According to some embodiments, a charge pump may optionally include more than two outputs for providing a plurality of bias voltages, for example, different bias voltages for UMTS-Transmit, UMTS-Receive, GSM-Transmit and GSM-Receive.

Figure 5:
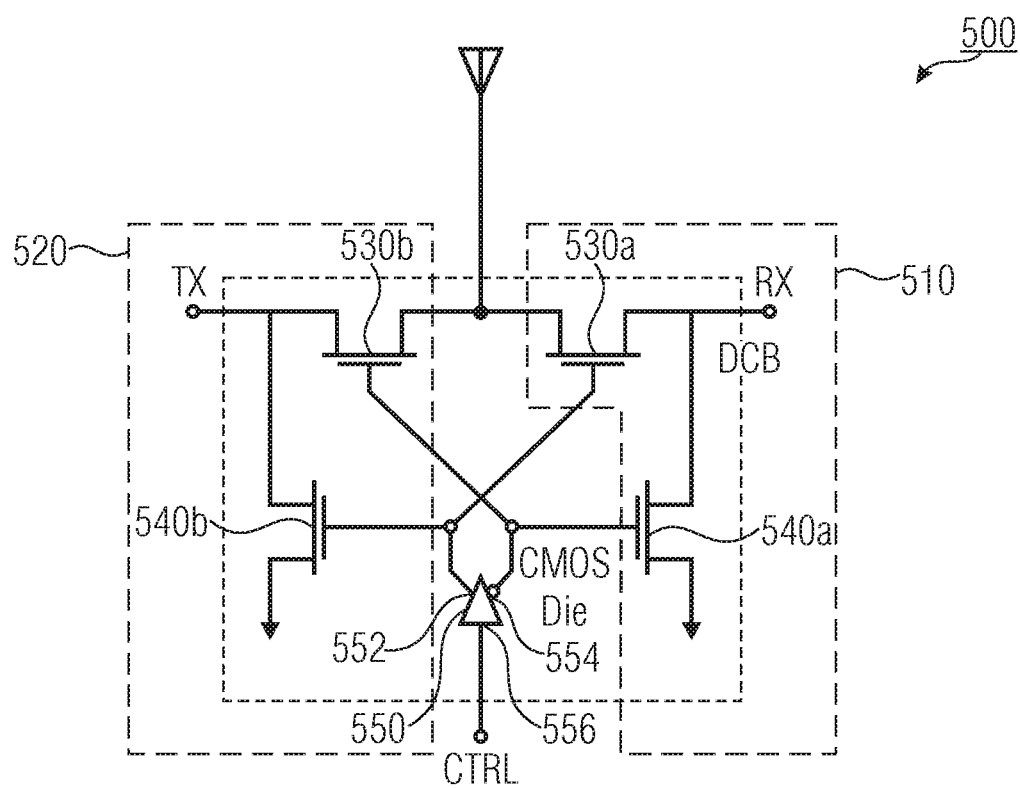
FIG. 5 shows a simplified schematic circuit diagram of a high-frequency switch.

FIG. 5 shows a simplified schematic circuit diagram of a high-frequency switch 500, in which a high-frequency switching circuit in accordance with an embodiment of the invention, for example, the high-frequency switching circuit 100 according to FIG. 1, may be implemented (or used). The high-frequency switch 500 is realized in a so called "common gate" configuration, wherein the principle circuit of the switch is shown in FIG. 5. The high-frequency switch 500 includes a first path 510, for example, a receive path, and a second path 520, for example, a transmit path. The first path 510 includes a first transistor 530*a*, which is a so-called series transistor and a second transistor 540*a*, which is a so-called shunt transistor. Analog to the first path 510, the second path 520 includes a first transistor 530*b*, which is a so-called series transistor, and a second transistor 540*b*, which is a so-called shunt transistor. A gate of the series transistor 530*a* of the first path 510 is coupled to a gate of the shunt transistor 540*b* of the second path 520 and to a first output 552 of an inverter 550. A gate of the series transistor 530*b* of the second path 520 is coupled to a gate of the shunt transistor 540*a* of the first path 510 and to a second output 554 of the inverter 550. The inverter 550 is configured to provide a switch state signal ("CTRL" in FIG. 5) received at an input 556 at the first output 552 and an inversed version of the switch state signal at the second output 554. Therefore a gate voltage of the series transistor 530*a* of the first path 510 is the same like (or slightly differs from) a gate voltage of the shunt transistor 540*b* of the second path 520 and inverse to a gate voltage of the series transistor 530*b* of the second path 520 and a gate voltage of the shunt transistor 540*a* of the first path 510 ("Common gate" Configuration). The transistors 530*a*, 530*b*, 540*a*, 540*b* may be high-frequency switching transistors, for example, like the high-frequency switching transistor 110 according to the FIGS. 1 and 4. Substrates of the high-frequency switching transistors 530*a*, 530*b*, 540*a*, 540*b* may be coupled to a control circuit 120, which is configured to selectively connect the substrates of the high-frequency switching transistors to two, or even more, different bias voltages. The series transistors 530*a*, 530*b* are used for the connection between TX (for example, a transmit port) and an antenna port or between RX (for example, a receive port) and the antenna port. The shunt transistors 540*a*, 540*b* are used to improve the isolation. This means, cross talking of the transistors (via the substrate or the gate/drain, gate/source resistors) is blocked. The switch state signal ("CTRL" in FIG. 5) is used for either activating the first path 510 or the second path 520. The first path 510 can, for example, be activated by applying a "high" signal to the first transistor 530*a* of the first path 510, which leads to a low ohmic resistance between the antenna port and RX by placing a channel-path of the first transistor 530*a* in a low impedance state. When the channel-path of the first transistor 530*a* of the first path 510 is placed in a low impedance state, a channel-path of the first transistor 530*b* of the second path 520 is placed in a high impedance state, which means blocking the second path 520. Furthermore, placing the channel-path of the first transistor 530*a* of the first path 510 in the low impedance state leads to a low impedance state of a channel-path of the second transistor 540*b* of the second path 520 and a high impedance state of a channel-path of the second transistor 540a of the first path 510 (because of the common gate configuration, described above), for a better isolation. For activating the second path 520 this principle works vice versa.

To enable a switching of higher voltage levels and power, in new technologies with relatively small breakdown voltages, transistors are stacked. This means the transistors are coupled in series, which is shown in FIG. 6.

Figure 6:
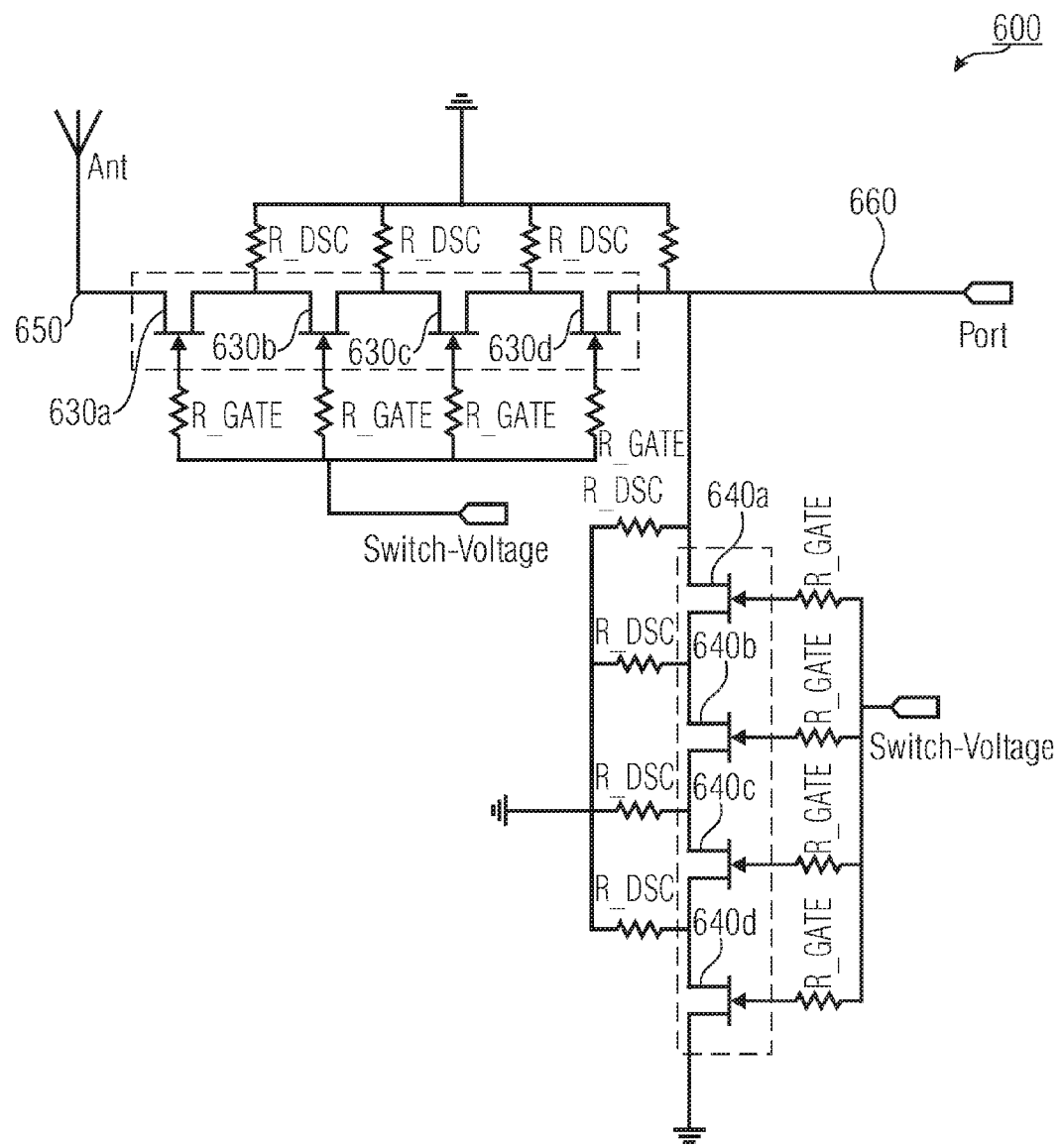
FIG. 6 shows a schematic circuit diagram of a high frequency switching circuit.

FIG. 6 shows a schematic circuit diagram of a high-frequency switching circuit 600, which, for example, could take the place of the first path (for example, the RX path) 510 of the high-frequency switch 500. The high frequency switching circuit 600 includes four series resistors 630a, 630b, 630c, 630d, which are stacked, which means that they are coupled in series. The four series transistors 630a, 630b, 630c, 630d have the same function like the series transistor 530a or the series transistor 530b of the high-frequency switch 500. This means that by placing the four series transistors 630a to 630d in a low impedance state, a low resistance path between an antenna or an antenna network, coupled to a second high-frequency connector 650 of the high frequency switching circuit 600, and a corresponding port, (for example, a receive port of receiver) coupled to a first high-frequency connector 660 of the high-frequency switching circuit 600, is established. The circuit 600 further includes four shunt transistors 640a, 640b, 640c, 640d, which have the same function like the shunt transistors 540a, 540b of the high-frequency switch 500, which means placing channel-paths of the four shunt transistors 640a to 640d in a low impedance state isolates the port from the antenna.

As mentioned before, in the high frequency switching circuit 600, in each path (series path and shunt path) four transistors are stacked to switch four times the normally (per transistor) allowed drain/source voltage. To avoid overstress of the gate/source voltages (i.e., not exceed the breakdown voltages) high ohmic resistors are desired (in the circuit 600 the resistors are designated with R_gate) between gates of the transistors and switch voltage terminals. By applying a positive voltage (at least bigger than a threshold voltage Vth of the transistors) to the resistors (to the gate resistors R_gate) the corresponding transistors (series transistors or shunt transistors) are "opened", which means channel-paths of the transistors are placed in a low impedance state. Vice versa applying, a negative voltage (or generally a voltage, which is smaller or even significantly smaller than the threshold voltage Vth) leads to a blocking of the channel-paths. The high frequency switching circuit 600 is typically configured such that, if the series path is open, the shunt path is closed and vice versa. In other words, if the channel-paths of the series transistors 630a to 630d are placed in a low impedance state, the channel-paths of the shunt transistors 640a to 640d are placed in a high impedance state and vice versa. Typical gate voltages for 0.35 micrometer CMOS technologies are in a range from +3 V for on (placing a channel-path in a low impedance state) and −3 V for off (placing a channel-path in a high impedance state). Higher voltages can lead to a degradation of the transistors, but typically lead to a minimal reduction of the drain source resistance of the transistor in the ON-case. A substrate bias voltage, like it may be applied using a high-frequency switching circuit 100 according to FIG. 1, enables the stacking of transistors and deactivates a drain bulk/diode of the transistors.

As mentioned before, the bias voltage of the substrate of the transistors does not need to be the same like the gate voltage, which means an off voltage of a transistor may be −3 Volt, and the substrate bias voltage may be significantly higher (in terms of magnitude), for example, −5 Volt. Like shown in the diagrams according to FIGS. 2 and 3, a substrate bias voltage has the influence of a C (V) curve, which means with higher voltages (e.g., with higher magnitude of a reverse voltage of source/drain capacitances) a bulk (substrate) of a transistor is cleared (depleted) better. This leads to the advantage, that intermodulation distortions may be improved furthermore, but the disadvantage that the substrate bias voltages are closer to the well breakdown voltages, which can lead to reliability problems. Embodiments of the invention solve this problem by switching the substrate bias voltages selectively, depending on the requirements in regards to intermodulation distortions. For example, when the high frequency switching circuit is implemented in mobile phones, a substrate bias voltage of high frequency transistors of the high frequency switching circuit may be on a "low" level most of the time, for example, in a receive case and, may only be on a "high" level in certain modes, for example, in a UMTS case.

Figure 7:
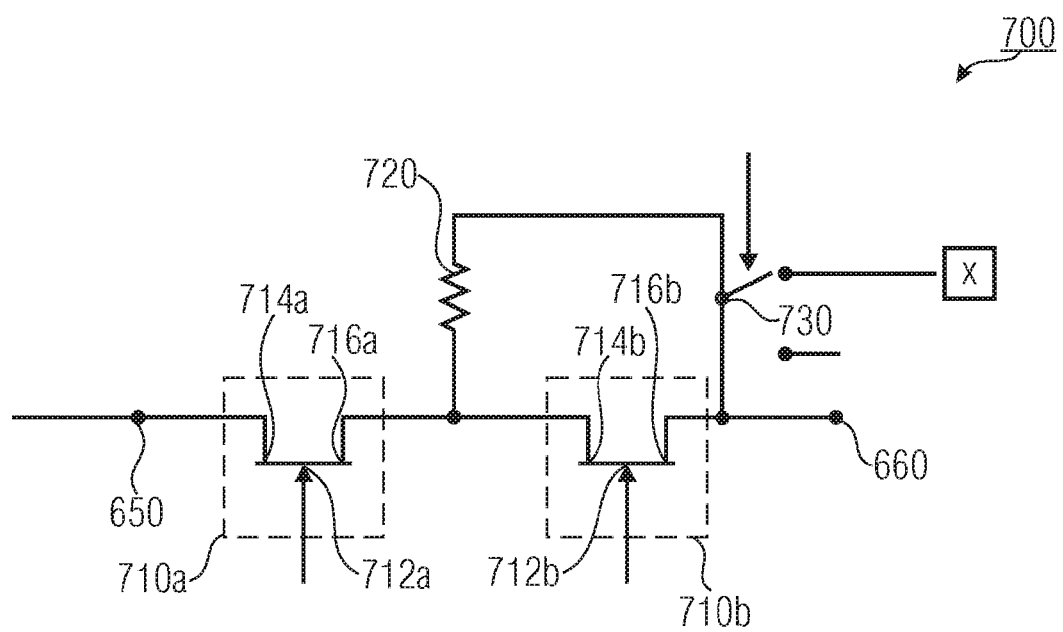
FIG. 7 shows a circuit diagram of a high-frequency switching circuit in accordance with an embodiment of the present invention.

FIG. 7 shows a schematic circuit diagram of a high-frequency switching circuit 700 in accordance with an embodiment of the present invention. The high-frequency switching circuit 700 includes a first high-frequency switching transistor 710a which includes a gate 712a, a first channel terminal 714a (for example, a source) and a second channel terminal 716a (for example, a drain). The high-frequency switching circuit 700 further includes a second high-frequency switching transistor 710b, which includes a gate 712b, a first channel terminal 714b (for example, a source) and a second channel terminal 716b (for example, a drain). A high-frequency signal path extends via a channel-path of the first high-frequency switching transistor 710a and a channel-path of the second high-frequency switching transistor 710b. The high-frequency signal path may, for example, establish a low ohmic connection between an antenna port and a high frequency signal terminal of the high-frequency switching circuit 700. The high frequency signal terminal may, for example, be coupled to a transceiver or a power amplifier or a low noise amplifier. The second channel terminal 716a of the first high-frequency switching transistor 710a is coupled to a potential node 730 via a channel resistor 720 (drain source resistor). The first channel terminal 714b of the second high-frequency switching transistor 710b is coupled to the second channel terminal 716a of the first high-frequency switching transistor 710a. The second channel terminal 716b of the second high-frequency switching transistor 710b is coupled to the potential node 730. The high-frequency switching circuit 700 is configured to selectively pull the potential node 730 to a predetermined potential or to leave the potential node 730 floating. The predetermined potential could be, for example, a ground potential, applied at (or presented at) a ground terminal of the high-frequency switching circuit 700.

The channel resistor 720 is used to provide a DC path to a predetermined potential, for example, ground potential, if the channel-paths of the high-frequency switching transistors 710a, 710b are in a high impedance state. In this case a high frequency signal path via the channel-paths of the high-frequency switching transistors 710a, 710b is blocked. However it is found that a potential difference between a potential of the second channel terminal 716a of the first high-frequency switching transistor 710a and the first channel terminal 714b of the second high-frequency switching transistor 710b and the predetermined potential (for example, ground potential) should be as low a possible, for improving the linearity of the high-frequency switching circuit 700. Therefore the channel resistor 720 is used to pull the potential of the second channel terminal 716a of the first high-frequency switching transistor 710a and the first channel terminal 714b of the second high-frequency switching transistor 710b to the predetermined potential (for example, ground potential) to improve the linearity of the high-frequency switching circuit 700.

In other words the channel resistor 720 is configured to deplete channel regions of the high-frequency switching transistors 710a and 710b.

In an ON-case, which means the channel-paths of the high-frequency switching transistors 710a and 710b are in a low impedance state, the channel resistor 720 would lead to an insertion loss, because of the ohmic path to the predetermined potential, for example, a ground potential. The high-frequency switching circuit 700 solves this problem by selectively switching the potential node 730 to the predetermined potential or to a "floating" state, wherein in the floating case no insertion loss (or at least no significant insertion loss), via the channel resistor 720, occurs. In other words the high-frequency switching circuit 700 may be configured to selectively pull the potential node 730 to the predetermined potential or to leave the potential node 730 floating, depending on a switch state of the high-frequency switching transistors 710a, 710b. For example, if the channel-paths of the first and the second high-frequency switching transistors 710a, 710b are placed in a low impedance state, a connection between the potential node 730 and the predetermined potential is interrupted. When the channel-paths of the first and second high-frequency switching transistors 710a, 710b are placed in a high impedance state, the potential node 730 is pulled to the predetermined potential, for example, ground potential, for example, via a low resistance path. This leads to a low or even negligible insertion loss in the ON-case (channel-paths are in a low impedance state) and to a high linearity in the OFF-case (channel-paths are in a high impedance state), due to a DC path from the second channel terminal 716a of the first high-frequency switching transistor 710a and the first channel terminal 714b of the second high-frequency switching transistor 710b to the predetermined potential via the channel resistor 720.

In other words, the linearity and current consumption of a high-frequency switching circuit may be improved if a clearing resistor (in FIG. 7 channel resistor 720) may be selectively "deactivated" (e.g., in that the clearing resistor is separated from the predetermined potential), if the clearing resistor is not needed or only small power signals have to be switched, for example, in a receive case.

According to some embodiments, the predetermined potential may further be a negative potential (e.g., in relation to a ground potential of the high frequency circuit 700), for example, −1V. The negative potential may (compared to a ground potential) lead to a further improvement of the linearity of the high frequency switching circuit 700 in the OFF-case.

Figure 8:
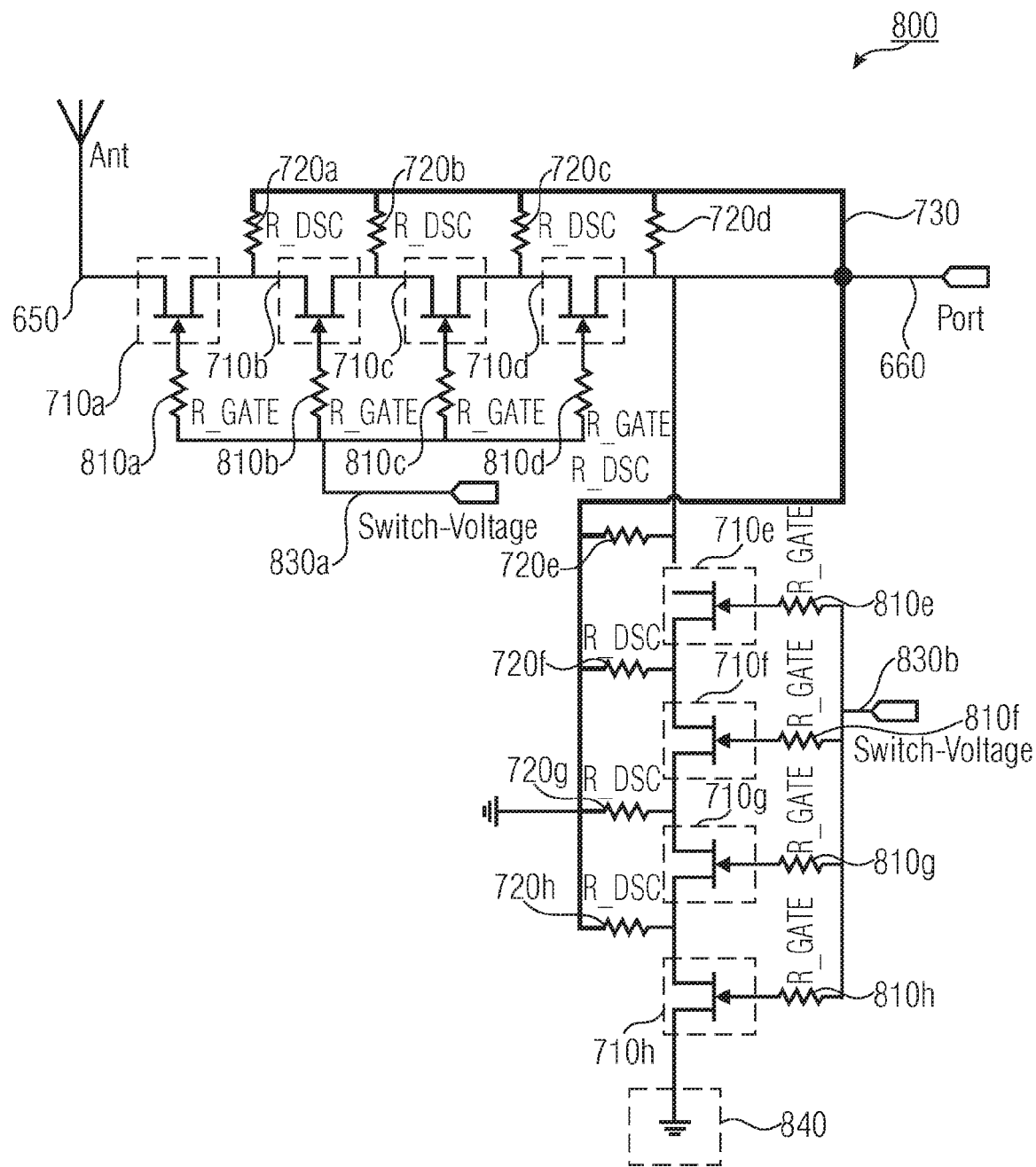
FIG. 8 shows a circuit diagram of a high-frequency switching circuit in accordance with an embodiment of the present invention.

FIG. 8 shows a schematic circuit diagram of a high-frequency switching circuit 800 in accordance with an embodiment of the invention. The high-frequency switching circuit 800 includes a first high-frequency switching transistor 710a, a second high-frequency switching transistor 710b, a third high-frequency switching transistor 710c and a fourth high-frequency switching transistor 710d. The four high-frequency switching transistors 710a to 710d are stacked, which means they are circuited in series, to switch four times an allowed drain/source voltage (allow for an overall voltage drop which is four times the allowed drain/source voltage), like mentioned before. A first channel terminal of the first high-frequency switching transistor 710a is coupled to a first high-frequency signal terminal or connector 650 of the high-frequency switching circuit 800, which can be coupled, for example, to an antenna network or an antenna. A second channel terminal of the first high-frequency switching transistor 710a is coupled, via a first channel resistor 720a, to a potential node 730. A gate of the first high-frequency switching transistor 710a is coupled to a first switch state signal line 830a via a first gate resistor 810a. A first channel terminal of the second high-frequency switching transistor 710b is coupled to the second channel terminal of the first high-frequency switching transistor 710a. A second channel terminal of the second high-frequency switching transistor 710b is coupled to the potential node 730 via a second channel resistor 720b. A gate of the second high-frequency switching transistor 710b is coupled to the first switch state signal line 830a via a second gate resistor 810b. A first channel terminal of the third high-frequency switching transistor 710c is coupled to the second channel terminal of the second high-frequency switching transistor 710b. A second channel terminal of the third high-frequency switching transistor 710c is coupled to the potential node 730 via a third channel resistor 720c. A gate of the third high-frequency switching transistor 710c is coupled to the first switch state signal line 830a via a third gate resistor 810c. A first channel terminal of the fourth high-frequency switching transistor 710d is coupled to the second channel terminal of the third high-frequency switching transistor 710c. A second channel terminal of the fourth high-frequency switching transistor 710d may be coupled to the potential node 730 directly or via a fourth channel resistor 720d. A gate of the fourth high-frequency switching transistor 710d is coupled to the first switch state signal line 830a via a fourth gate resistor 810d. The second channel terminal of the fourth high-frequency switching transistor 710d may be further coupled to a second high-frequency signal terminal or connector 660 of the high-frequency switching circuit 800. The high-frequency switching circuit 800 further includes a fifth high-frequency switching transistor 710e, a sixth high-frequency switching transistor 710f, a seventh high-frequency switching transistor 710g and an eighth high-frequency switching transistor 710h. The high-frequency switching transistors 710e to 710h are stacked as shunt transistors, as shown in FIGS. 5 and 6, for providing good isolation and power handling capabilities if channel-paths of the four high-frequency switching transistors 710a-710d are placed in a high impedance state. A first channel terminal of the fifth high-frequency switching transistor 710e is coupled to the second channel terminal of the fourth high-frequency switching transistor 710d. The first channel terminal of the fifth high-frequency switching transistor 710e may be further coupled to the potential node 730 directly or via a fifth channel resistor 720e. A second channel terminal of the fifth high-frequency switching transistor 710e is coupled, via a sixth channel resistor 720f, to the potential node 730. A gate of the fifth high-frequency switching transistor 710e is coupled to a second switch state signal line 830b via a fifth gate resistor 810e. A first channel terminal of the sixth high-frequency switching transistor 710f is coupled to the second channel terminal of the fifth high-frequency switching transistor 710e. A second channel terminal of the sixth high-frequency switching transistor 710f is coupled to the potential node 730 via a seventh channel resistor 720g. A gate of the sixth high-frequency switching transistor 710f is coupled to the second switch state signal line 830b via a sixth gate resistor 810f. A first channel terminal of the seventh high-frequency switching transistor 710*g* is coupled to the second channel terminal of the sixth high-frequency switching transistor 710*f*. A second channel terminal of the seventh high-frequency switching transistor 710*g* is coupled to the potential node 730 via an eighth channel resistor 720*h*. A gate of the seventh high-frequency switching transistor 710*g* is coupled to the second switch state signal line 830*b*, via a seventh gate resistor 810*g*. A first channel terminal of the eighth high-frequency switching transistor 710*h* is coupled to the second channel terminal of the seventh high-frequency switching transistor 710*g*. A gate of the eighth high-frequency switching transistor 710*h* is coupled to the second switch state signal line 830*b* via an eighth gate resistor 810*h*. A second channel terminal of the eighth high-frequency switching transistor 710*h* is coupled to a reference potential node 840, which, for example, may be a ground node or ground terminal of the high frequency switching circuit 800. In other words the reference potential node 840 can, for example, have a ground potential.

In the following, the function of the high-frequency switching circuit 800 shown in FIG. 8 is explained in detail. It is assumed that applying a "high" voltage, for example, +3, V to the gates of the high-frequency switching transistors 710*a* to 710*h* leads to a low impedance state of channel-paths of the high-frequency switching transistors 710*a* to 710*h*. It is further assumed that applying a "low" voltage, for example, −3 V to the gates of the high-frequency switching transistors 710*a* to 710*h* leads to a high impedance state of the channel-paths of the high-frequency switching transistors 710*a* to 710*h*, which, for example, may be NMOS-transistors.

The high-frequency switching circuit 800 may further include a switch state control circuit, which is configured to apply potentials to the first switch signal line 830*a* and the second switch state signal line 830*b*, wherein a potential of the first switch state signal line 830*a* is inverse with respect to a potential of the second switch state signal line 830*b*. By applying a "high" signal (for example, +3V) to the first switch state signal line 830*a* and a "low" signal (for example, −3V) to the second switch state signal line 830*b*, the channel-paths of the high-frequency switching transistors 710*a* to 710*d* are placed in a low impedance state and the channel-paths of the high-frequency switching transistors 710*e* to 710*h* are placed in a high impedance state. In this case, the potential node 730 is floating in that a low resistance connection between the potential node 730 and the reference potential node 840 (e.g., the ground node) is interrupted. A high-frequency signal, for example, an incoming high-frequency signal, can be routed via the channel-paths of the high-frequency switching transistors 710*a* to 710*d*, for example, from the first high-frequency signal terminal or connector 650 to the second high-frequency signal terminal or connector 660, without (or without significant) insertion loss at the channel resistors 720*a* to 720*d*, because of the floating potential node 730. In other words, the channel resistors 720*a* to 720*d* have no influence (or no significant influence) on the high-frequency signal path extending via the channel-paths of the high-frequency switching transistors 710*a* to 710*d*. In a transmit case, this leads to a lower current consumption of the high-frequency switching circuit 800 and in a receive case, this leads to a higher sensitivity of the high-frequency switching circuit 800.

If a low voltage signal (−3V) is applied to the first switch state signal line 830*a* and a high voltage signal (+3V) to the second switch state signal line 830*b*, the channel-paths of the high-frequency switching transistors 710*a* to 710*d* are placed in a high impedance state, and the channel-paths of the high-frequency switching transistors 710*e* to 710*h* are placed in a low impedance state, and the potential node 730 is pulled to the predetermined potential. In other words, a (low resistance) DC path between the potential node 730 and the reference potential node 840 is established, wherein a potential of the reference potential node 840 can, for example, be a ground potential. In this case, no potentials (potential differences) between the coupled channel terminals of the high-frequency switching transistors 710*a* to 710*d* may be established, for example by parasitic substrate effects, which leads to an improvement of the linearity of the high-frequency switching circuit 800.

In other words, the linearity and the current consumption of a high-frequency switching circuit may be further improved if the clearing resistors R_DSC (channel resistors 720*a* to 720*h*) are switched depending on a state of the high-frequency switching circuit 800. These clearing resistors are placed between the source and drain terminals of the stacked transistors, in other words, between the channel terminals of the stacked transistors, to deplete charge carriers, which may be produced under the transistors. Because of the position of these clearing resistors in a high-frequency signal path, they could lead to a loss in HF power. The high-frequency switching circuit 800 solves this problem by selectively deactivating (leaving the potential node 730 floating) the clearing resistors, for example, if only small HF powers need to be switched, for example, in a receive case.

In other words, if an HF signal path is switched, the corresponding clearing resistors are switched together with the HF signal path. In an HF signal path off-case, the clearing resistors are pulled to the predetermined potential (for example, ground potential), thus improving the linearity, and in an HF signal path on-case, the clearing resistors are left floating, thus reducing the current consumption of the high frequency switching circuit.

Furthermore, leaving the clearing resistors floating leads to a reduction of the insertion loss and to a reduction of leaking currents, which would normally lead to a higher current consumption of the negative charge pump.

According to some embodiments, a high frequency switching circuit may include a plurality of high frequency switching transistors, depending on the drain/source voltages (or the overall signal voltage) that have to be switched, or the power of a high frequency signal being switched via channel paths of the high frequency switching transistors.

According to some embodiments, a high frequency signal may, for example, be a GSM signal or an UMTS signal, transmitted from a mobile phone or received by a mobile phone.

According to some embodiments, a resistance value of the channel resistors 720*a* to 720*h* (R_DSC) may be bigger than 10 kΩ or bigger than 100 kΩ and in some case the resistance value of the channel resistors 720*a* to 720*h* may be bigger than a resistance value of the gate resistors 810*a* to 810*h* (R_Gate).

Figure 9:
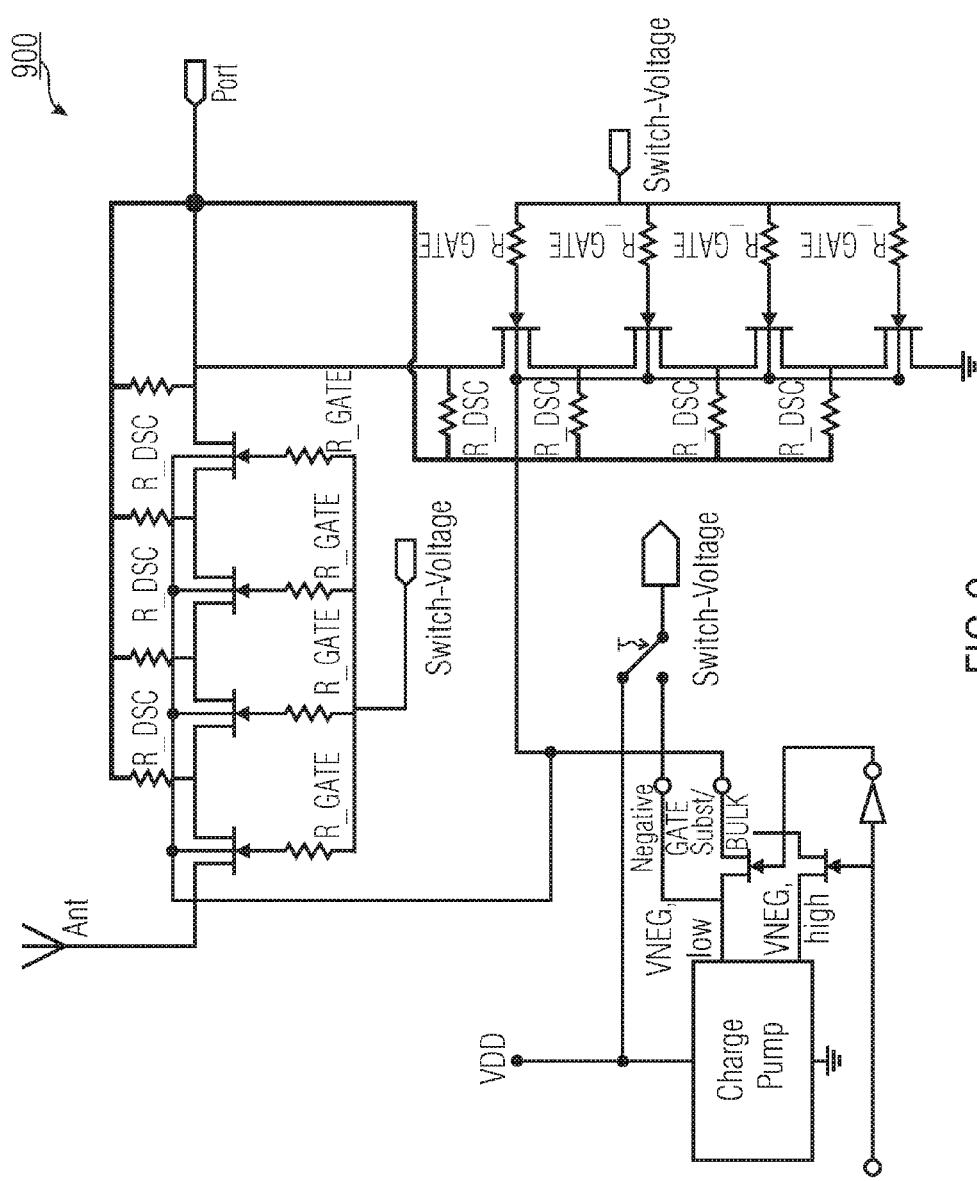
FIG. 9 shows a circuit diagram of a high-frequency switching circuit in accordance with an embodiment of the present invention.

FIG. 9 shows a schematic circuit diagram of a high-frequency switching circuit 900 in accordance with an embodiment of the present invention. The high-frequency switching circuit 900 combines the above described two aspects of the invention. In the high-frequency switching circuit 900 a substrate bias voltage of the high-frequency switching transistors may be switched, depending on a control signal, for reducing power consumption of the high-frequency switching circuit 900 and improving the linearity of the high-frequency switching circuit 900, and furthermore the clearing resistors R_DSC (channel resistors) may selectively be switched to a predetermined potential (for example, ground) or be left floating, for further improvement of linearity and current consumption. In other words, the high-frequency switching circuit 900 combines a switching of a substrate bias voltage of the high frequency switching transistors with a function to selectively activate or deactivate the clearing resistors between channel terminals of the high frequency switching transistors. The high-frequency switching circuit 900 can, for example, be part of a high-frequency CMOS-switch or high-frequency CMOS-amplifier and can, for example, be part of a receive path or part of a transmit path of the CMOS-switch or the CMOS-amplifier. A high-frequency switch may implement two of the high-frequency switching circuits 900, for example, one for the receive path and one for the transmit path, like shown in FIG. 5. A negative gate voltage for the high-frequency switching transistors of the high-frequency switching circuit 900 may be provided from the charge pump of high-frequency switching circuit 900, which can also provide the two bias substrate potentials. A high gate potential can, for example, be a supply potential derived from a supply voltage terminal of the high frequency switch.

In a UMTS transmit case, a high bias potential may be applied to the substrates of the high-frequency switching transistors, by applying the second bias potential (for example, −5V), which is provided from the charge pump to the substrates of the high-frequency switching transistors. The channel-paths of the series high-frequency switching transistors are placed in a low impedance state and the channel-path of the shunt high-frequency transistors are placed in a high impedance state, wherein the potential node is left floating, which means the clearing resistors don't influence (or at least not influence significantly) a high-frequency signal path extending via the channel-paths of the series high-frequency switching transistors. In a GSM transmit case, a low substrate bias voltage could be provided to the substrates of the high-frequency switching transistors, by applying the first bias potential (for example, −3V) to the substrates of the high-frequency switching transistors, but the clearing resistors would be left floating, like in the UMTS case. In other words, a substrate bias potential of the high-frequency switching transistors may be independent from the switch state of the high-frequency switching transistors.

Figure 10:
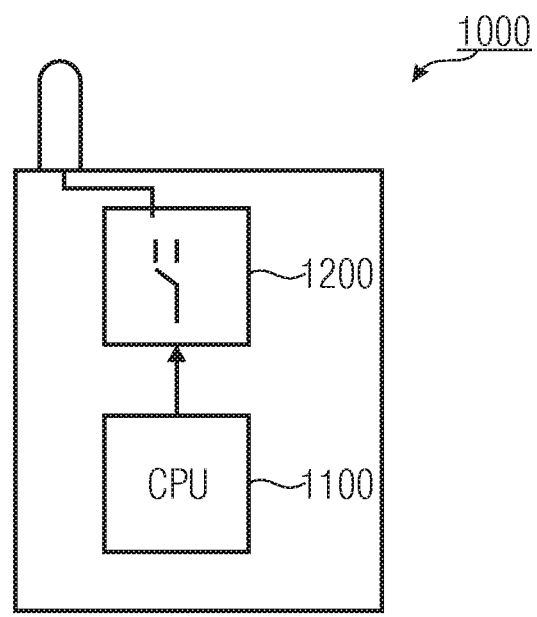
FIG. 10 shows a block schematic diagram of a mobile phone in accordance with an embodiment of the present invention.

FIG. 10 shows a block diagram of a mobile phone 1000 in accordance with an embodiment of the present invention. The mobile phone 1000 includes a processor 1100, for example, a CPU and a high-frequency switching circuit 1200, which could, for example, be equal to the high-frequency switching circuit 100 according to FIG. 1. The processor 1100 is configured to provide a control signal (for example, the control signal 140 according to FIG. 1) depending on the state of the mobile phone 1000 (for example, UMTS on or off). Intermodulation distortions of the mobile phone 1000 are lower, i.e., an intermodulation characteristic of the mobile phone 1000 is better, in a first state (for example UMTS mode on) than in the second state (for example, UMTS mode off), and a current consumption of the mobile phone 1000 is lower when the mobile phone 1000 is in the second state than when the mobile phone 1000 is in the first state. In other words, the processor 1100 is configured to only activate the UMTS mode, which means for the high-frequency switching circuit 1200 applying a high bias potential (for example, −5V) to the substrates of the high frequency switching transistors of the high-frequency switching circuit 1200 to gain a good intermodulation characteristic, when it is needed, and to have a low current consumption in all other cases. This optimizes a trade-off in the mobile phone between good intermodulation characteristics and power consumption.

Embodiments of the present invention allow for a design of an HF-switch with better intermodulation characteristics and a current saving function. In other words, embodiments according to the present invention provide a better trade-off between intermodulation characteristic and current consumption than commonly known switching circuits, for example, commonly known HF-switches.

Embodiments of the present invention may be applicable, for example, in HF-CMOS switches or HF-CMOS amplifiers.

What is claimed is:
1. A mobile phone comprising:
a high-frequency switching circuit comprising a high-frequency switching transistor, wherein a high-frequency signal-path between a high-frequency signal receiver or transmitter and a high-frequency antenna of the mobile phone extends via a channel-path of the high-frequency switching transistor;
a control circuit, configured to apply at least two different bias potentials to a substrate of the high-frequency switching transistor, depending on a control signal received by the control circuit; and
a processor, wherein the processor is configured to provide the control signal to the high-frequency switching circuit, depending on a state of the mobile phone;
wherein the processor is configured to provide the control signal such that intermodulation distortions of the mobile phone are lower, when the mobile phone is in a first state than in a second state; and such that a current consumption of the mobile phone is lower, when the mobile phone is in the second state than in the first state; and
wherein the first state is an UMTS mode and wherein the second state is a GSM mode.

2. The mobile phone according to claim 1, wherein the control circuit comprises a switchable voltage source and wherein the switchable voltage source is configured to provide the at least two different bias potentials.

3. The mobile phone according to claim 2, wherein the switchable voltage source comprises a charge pump, the charge pump comprising a first output and a second output;
wherein the first output of the charge pump is configured to provide a first of the at least two different bias potentials;
wherein the second output of the charge pump is configured to provide a second of the at least two different bias potentials; and
wherein the control circuit is configured to selectively connect the substrate of the high-frequency switching transistor to the first output or the second output, depending on the control signal.

4. The mobile phone according to claim 3, wherein the charge pump is configured to provide the at least two different bias potentials simultaneously; and
wherein the first output of the charge pump is configured to selectively provide a gate potential to a gate of the high-frequency switching transistor, in dependence on a switch state signal.

5. The mobile phone according to claim 4, wherein a potential difference between a second bias potential of the at least two different bias potentials and a ground potential, applied to a ground terminal of the high-frequency switching circuit, is bigger than a potential difference between a first bias potential of the at least two different bias potentials and the ground potential.

6. The mobile phone according to claim 4, wherein the control circuit further comprises:
a first control circuit switching transistor;
a second control circuit switching transistor; and
an inverter;
wherein the inverter is configured to receive the control signal at an input of the inverter and to provide an inverted version of the control signal at an output of the inverter;
wherein a gate of the first control circuit switching transistor is coupled to the input of the inverter;
wherein a first channel terminal of the first control circuit switching transistor is coupled to the second output of the charge pump;
wherein a second channel terminal of the first control circuit switching transistor is coupled to the substrate of the high-frequency switching transistor;
wherein a gate of the second control circuit switching transistor is coupled to the output of the inverter;
wherein a first channel terminal of the second control circuit switching transistor is coupled to the first output of the charge pump; and
wherein a second channel terminal of the second control circuit switching transistor is coupled to the substrate of the high-frequency switching transistor.

7. The mobile phone according to claim 5, wherein the at least two bias potentials are chosen such that intermodulation distortions of the high-frequency switching circuit are lower when the second bias potential is applied to the substrate of the high-frequency switching transistor than when the first bias potential is applied to the substrate of the high-frequency switching transistor, and such that a power consumption of the high-frequency switching circuit is lower when the first bias potential is applied to the substrate of the high-frequency switching transistor than when the second bias potential is applied to the substrate of the high-frequency switching transistor.

8. A mobile phone comprising:
a high-frequency switching circuit comprising a high-frequency switching transistor, wherein a high-frequency signal-path extends via a channel-path of the high-frequency switching transistor;
a control circuit, configured to apply at least two different bias potentials to a substrate of the high-frequency switching transistor, depending on a control signal received by the control circuit; and
a processor, configured to provide the control signal to the high-frequency switching circuit, depending on a state of the mobile phone;
wherein the processor is configured to provide the control signal such that intermodulation distortions of the mobile phone are lower, when the mobile phone is in a first state than in a second state, and such that a current consumption of the mobile phone is lower, when the mobile phone is in the second state than in the first state;
wherein the first state is an UMTS mode and wherein the second state is a GSM mode;
wherein the control circuit comprises a switchable voltage source and wherein the switchable voltage source is configured to provide the at least two different bias potentials;
wherein the switchable voltage source comprises a charge pump, the charge pump comprising a first output and a second output;
wherein the first output of the charge pump is configured to provide a first of the at least two different bias potentials;
wherein the second output of the charge pump is configured to provide a second of the at least two different bias potentials;
wherein the control circuit is configured to selectively connect the substrate of the high-frequency switching transistor to the first output or the second output, depending on the control signal;
wherein the charge pump is configured to provide the at least two different bias potentials simultaneously; and
wherein the first output of the charge pump is configured to selectively provide a gate potential to a gate of the high-frequency switching transistor, in dependence on a switch state signal.

* * * * *